United States Patent
Schwarte

(10) Patent No.: US 6,777,659 B1
(45) Date of Patent: Aug. 17, 2004

(54) DEVICE AND METHOD FOR DETECTING THE PHASE AND AMPLITUDE OF ELECTROMAGNETIC WAVES

(75) Inventor: Rudolf Schwarte, Kreuztaler Strasse 56, D-57250 Netphen (DE)

(73) Assignee: Rudolf Schwarte, Netphen (DE)

( * ) Notice: Subject to any disclaimer, the term of this patent is extended or adjusted under 35 U.S.C. 154(b) by 0 days.

(21) Appl. No.: 09/700,439

(22) PCT Filed: May 10, 1999

(86) PCT No.: PCT/DE99/01436

§ 371 (c)(1),
(2), (4) Date: Nov. 13, 2000

(87) PCT Pub. No.: WO99/60629

PCT Pub. Date: Nov. 25, 1999

(30) Foreign Application Priority Data

May 18, 1998 (DE) ......................................... 198 21 974

(51) Int. Cl.$^7$ ........................ H01L 27/00; H01L 27/146
(52) U.S. Cl. ................................. 250/208.1; 250/214.1
(58) Field of Search ................................. 348/272, 275, 348/281, 282, 302, 311; 250/208.1, 338.4, 338.1, 370.01, 372, 210, 214 R, 214 LA, 214 A, 214.1

(56) References Cited

U.S. PATENT DOCUMENTS

| | | | |
|---|---|---|---|
| 4,314,275 A | | 2/1982 | Chapman |
| 4,812,640 A | * | 3/1989 | Wilwerding ............... 250/204 |
| 4,826,312 A | * | 5/1989 | Lambeth ..................... 356/3.07 |
| 4,985,619 A | * | 1/1991 | Arques ..................... 250/208.1 |
| 5,051,797 A | * | 9/1991 | Erhardt ........................ 257/230 |
| 5,262,871 A | * | 11/1993 | Wilder et al. ................ 348/307 |
| 5,420,634 A | * | 5/1995 | Matsumoto .................. 348/311 |
| 5,955,753 A | * | 9/1999 | Takahashi ................... 257/292 |

FOREIGN PATENT DOCUMENTS

| | | | | |
|---|---|---|---|---|
| DE | WO 98/10255 | | 3/1998 | |
| DE | 19704496 A1 | | 3/1998 | |
| WO | WO 9810255 A1 | * | 3/1998 | ............. G01J/9/00 |
| WO | WO 98/10255 1 | * | 3/1998 | ............. G01J/9/00 |

* cited by examiner

Primary Examiner—Edward J. Glick
Assistant Examiner—Chih-Cheng Glen Kao
(74) Attorney, Agent, or Firm—Paul & Paul

(57) ABSTRACT

The presented invention concerns an apparatus for detecting the phase and amplitude of electromagnetic waves, comprising at least two modulations photogates which are sensitive to the electromagnetic waves, and accumulating gates which are associated with the modulation photogates and which are not photosensitive, and electrical connections for the modulation photogates and the accumulation gates so that the latter can be connected to a reading-out device and the former can be connected to a modulating device which increases and reduces the potential of the modulation photogates relative to each other and relative to the preferably constant potential of the accumulation gates corresponding to a desired modulation function. It is proposed in accordance with the invention that a plurality of modulation photogates and accumulation gates are provided in the form of long narrow parallel strips which group-wise form a PMD-pixel.

27 Claims, 12 Drawing Sheets

DEVICE AND METHOD FOR DETECTING THE PHASE AND AMPLITUDE OF ELECTROMAGNETIC WAVES

THE BACKGROUND OF THE INVENTION

The invention concerns an apparatus for detecting the phase and amplitude of electromagnetic waves, more specifically preferably in the optical and in the near infrared and ultraviolet range, comprising at least two modulation photogates which are sensitive to the electromagnetic waves (or photosensitive) and accumulation gates which are associated with the modulation photogates and which are not photosensitive or shaded, and electrical connections for the modulation photogates and the accumulation gates so that the latter can be connected to a reading-out device and the former can be connected to a modulating device, wherein the modulating device increases or reduces the potential of the modulation photogates relative to each other and also relative to the preferably constant potential of the accumulation gates corresponding to a desired modulation function.

Such an apparatus is known by the term 'photomixing detector' (abbreviated as PMD) from German patent applications Nos 196 35 932.5 and 197 04 496.4 and international patent application PCT/DE97/01956 based on the two applications referred to above.

The above-indicated applications are to the same inventor and were filed for the applicant of the present application, and reference is made to the entire disclosure of those previous applications insofar as described therein are the basic mode of operation, performance and possible uses of photomixing detectors. The present invention therefore does not discuss those fundamental functions of photomixing detectors but is concerned primarily with specific configurations and uses of photomixing detectors, by which the elements that are already known are optimised.

By virtue of the inherent mixing procedure which is implemented upon reception of the light which is modulated, reflected or emitted by an object, by the modulation photogates which are modulated with the same modulation function, the known PMDs are in a position directly to detect the transit time of the electromagnetic waves reflected by the object and therewith, besides lateral locational resolution which is ensured by means of a suitable optical system as in conventional cameras, simultaneously also to obtain items of spacing Information about the recorded pixels. Those PMDs therefore permit direct three-dimensional surveying and measurement of surfaces without the need for expensive evaluation procedures and recording procedures at various angles.

In order to achieve adequate sensitivity and depth resolution in the case of the known PMDs, the pixel surfaces must be sufficiently large so that, during the recording duration of an individual image, sufficient electromagnetic radiation is received from the various surface regions of the object and a suitable number of charge carriers is produced in the photosensitive material as ultimately the spacing information is obtained by way of the different number of charge carriers which occur at different moments in time at the modulation photogates and are accumulated by way of the immediately adjoining accumulation gates.

That entails a certain minimum size in regard to the area of the individual pixels. Problems can also occur with the conventional PMDs by virtue of the fact that very sharp light-dark boundaries of the object are produced in the image. If such a light-dark boundary falls by chance on the boundary region between adjacent modulation photogates, then the different number of charge carriers at the adjacent accumulation gates thus fakes a correlation result which leads to incorrect interpretation in the sense of depth information.

In addition the transit times in photosensitive pixel elements of that kind, which are of relatively large area, are comparatively long so that the band width or the limit value of the modulation frequency is usually only in the region of a few megahertz to a maximum of 100 MHz. Band widths of at least 1 GHz are desired in particular for the use of corresponding photosensitive detectors, for example in the opto-electronic art and in optical signal transmission.

In addition a higher level of functionality and flexible use of the PMD-pixels and PMD-arrays is desirable for different uses, for example for implementing different modes of operation with the same pixels, in particular for reasons of economy.

SUMMARY OF THE INVENTION

Having regard to the foregoing, the object of the present invention is to provide an apparatus for detecting the phase and amplitude of electromagnetic waves, having the features set forth in the opening part of this specification, which has a markedly improved band width, in which moreover misinterpretations of light-dark boundaries on imaged surfaces are less probable or even excluded, and with which a higher level of functionality and economy in practical uses is achieved.

That object is attained in that the modulation photogates like also the accumulation gates are provided in the form of long narrow parallel strips in mutually juxtaposed relationship, which group-wise form a PMD-pixel, and wherein the accumulation gates are in the form of reading-out diodes.

The fact that the modulation photogates and the accumulation gates are in the form of narrow long strips and the arrangement thereof in parallel directly mutually juxtaposed relationship results in very short channel lengths for the gates (the modulation gate strip width is referred to as the gate length, from MOS-transistor technology). The free charge carriers produced in or under the modulation photogates drift only transversely with respect to the strip direction by the short distance of the gate length to the adjoining accumulation gate, in which respect that drift is supported by a suitable electrical field on the part of the modulation voltage at the modulation photogates. As a result the drift times fall for example below 1 nanosecond so that accordingly it is possible to achieve a usable modulation band width of 1 GHz. Even if the individual strips of the modulation photogates and also the accumulation gates are relatively narrow, nonetheless by virtue of their corresponding length they can afford a sufficiently large photosensitive area while in addition it will be appreciated that a plurality of alternately arranged, strip-shaped modulation photogates and accumulation gates can be connected together to form a unit with almost a doubling of the optical filling factor. In that way virtually any pixel shapes and pixel sizes can be embodied by strip structures of that kind, without a limitation in terms of modulation band width.

The preferred embodiment of the invention provides that the individual modulation photogates are of a width which is greater than that of the respectively adjoining accumulation gates, while in addition the width of the modulation photogates should if possible be smaller than the diffraction limit of the imaging optical system for the modulated light detected by those elements, and should preferably be of the order of magnitude of the wavelength or a few wavelengths of that light or that electromagnetic wave. This means that, by virtue of diffraction effects, sharp light-dark boundaries can no longer accidentally fall on the region between two adjacent modulation photogates which are modulated in push-pull relationship. On the contrary the small dimensions of the modulation photogates in the transverse direction provide that a shadow or light-dark boundary must be spread over the full width of those gates so that both adjacent gates are equally still acted upon by light. In addition, with very long, correspondingly narrow modulation photogates, it is in any case highly improbable that a light-dark boundary extends precisely parallel to the direction of those strips. With the slightest inclination relative to the strips however at any event the two adjacent modulation photogates which are modulated in push-pull relationship are substantially equally acted upon with light from the light part and the dark part of the respective object whose image is produced.

The strip length of the modulation photogates and also of the accumulation gates should if possible be at least ten times to one hundred times the width thereof. The width of the pixels formed from a plurality of modulation photogates and accumulation gates should overall be approximately of the same order of magnitude as the length, which means that about 10–100 strips are to be arranged in mutually juxtaposed relationship, of which about a third are accumulation gates and about two thirds are modulation photogates. In another embodiment of the invention however it is possible also to arrange three or even more modulation photogates in the form of corresponding strips to improve the potential configuration between each two accumulation gates, in which case the central modulation photogate should be unmodulated. In addition, a preferred embodiment of the invention is one in which, as viewed in the transverse direction with respect to the strips, in a pixel, there are always two modulation photogate strips alternating with an accumulation gate strip, wherein the two immediately mutually juxtaposed modulation photogates are connected in such a way that their potential can be modulated in push-pull relationship with respect to each other, wherein the accumulation gates each have a preferably constant, lower energy potential, that is to say for example positive potential for the photoelectrons, which provides that the charge carriers produced under the two modulation photogates drift predominantly to the side of that modulation photogate which assumes the low energy potential value and from there go to the accumulation gate arranged on that side of the two strips. In that case the two modulation photogate strips which are arranged on respective sides of an accumulation gate are modulated in push-pull relationship, that is to say at a given moment in time an accumulation gate simultaneously receives charge carriers from both modulation photogate strips adjacent thereto while the respectively adjacent accumulation gate is adjacent to two modulation photogate strips which at that moment in time are precisely at a higher potential so that only very few charge carriers go to that accumulation gate. Accordingly each second respective accumulation gate is also connected to one and the same reading-out line and the remaining accumulation gates are connected to another reading-out line, wherein the sum signal of those two lines reproduces the amplitude of the received light while the difference signal directly specifies the value of the correlation signal which arises out of modulation of the received light and simultaneous modulation with the same modulation function of the directly adjacent modulation photogates in push-pull relationship.

That also occurs in a completely analogous fashion when using a third modulation photogate which would additionally be arranged between the two above-mentioned modulation photogates and which for example could be disposed at a constant mean potential while the two adjacent photogates could be increased and reduced with the modulation voltage in push-pull relationship relative to the central gate. In that way the potential configuration can also be smoothed somewhat and the level of efficiency in regard to unilateral displacement of the charge carriers could be increased in accordance with the respective current value of the modulation voltage.

In accordance with the invention the accumulation gates are in the form of reading-out diodes.

In the possible voltage reading-out mode the photocharges which are distributed in accordance with the push-pull modulation voltages are stored on the capacitances of the accumulation gates—in this case on the barrier layer capacitances of the reading-out diodes which are connected in the blocking direction (for example pn-diodes or Schottky diodes)—and ascertained with a high-ohmic reading-out apparatus.

In the current reading-out mode which is preferred herein the arriving photocharge is transmitted directly to the reading-out circuit with a practically unaltered potential of the reading-out electrode.

As in the case of the semiconductor materials which are current at the present time for the uses of this invention, electron mobility is greater than that of the holes or defect electrons, preferably photoelectrons are directionally modulated by the modulation photogates and distributed in accordance with the modulation voltage to the accumulation gates or reading-out diodes. In this case the anodes of the reading-out diodes are preferably at common ground potential while the cathodes are at positive potential and are connected as reading-out electrodes $K_+$ and $K_-$ respectively to the reading-out circuit.

The above-discussed two kinds of accumulation gates $K_+$ and $K_-$ alternate with each other in a group of accumulator gates and modulation gates which in accordance with the invention operate in parallel and which form a novel PMD-pixel of highest band width, in accordance with the invention, in a manner such that for example a positive modulation photogate voltage results in a photocharge enrichment at the $K_+$-accumulation gates or a photocharge depletion at the $K_-$-accumulation gates, wherein the accumulation gates are used double by virtue of the double-sided charge accumulation and almost double the optical degree of filling internal to the pixels and noticeably reduce parasitic capacitances.

In a preferred embodiment of the invention two pixels respectively comprising a plurality of parallel strips of modulation photogates and accumulation gates are arranged in directly mutually juxtaposed relationship, here referred to as 2-quadrature pixels. In this respect it is to be pointed out that in the transverse direction the pixels are respectively terminated by an individual modulation photogate adjoining the last accumulation gate strip in that direction, and not by a pair, as is the case between the accumulation gates. If two such pixels are arranged in directly mutually juxtaposed relationship, then those two terminal strips which each form a respective modulation photogate of a respective one of the two pixels come to lie in mutually juxtaposed relationship and the two pixels which are separated in themselves can now be modulated in such a way that the two mutually juxtaposed modulation photogates are modulated in push-pull relationship with respect to each other, which effectively amounts to having the pixel surface area doubled at the same modulation voltage and phase, with a unitary larger pixel being formed from the two individual pixels. As however in this configuration the two halves of that larger pixel can in principle be modulated independently of each other, the modulation function can equally well also be displaced in respect of phase or transit time in regard to the one pixel through 90° or a suitable delay $T_D$, in relation to the other pixel. That means that in-phase and quadrature signals are measured at the same time so that in that fashion complete information about the phase position of the correlation function is obtained in parallel and simultaneous relationship.

In that case the accumulation gate connections or terminals are desirably respectively provided at the end of one of the pixels. The modulation photogate connections or terminals are preferably provided in the form of push-pull strip lines from both ends or strip ends of the pixel surfaces, more specifically in particular in the case of especially long strips so in addition by virtue of transversely extending push-pull strip lengths in each case as a multiple and at equal spacings. That prevents the modulation signal being attenuated and deformed over the length of the gate by virtue of the electrical surface resistance of the modulation photogate, so that the ascertained correlation function is also correspondingly deformed.

A particularly preferred embodiment of the invention is one in which four pixels are arranged in a rectangle or square and form a unit, more specifically in such a way that the strips of pixels arranged in the square or rectangle in respective diagonal relationship with each other extend parallel to each other while the strips of the directly adjacently disposed pixels extend perpendicularly to each other, thereby substantially avoiding in particular troublesome mutual overcoupling effects. This embodiment is referred to herein as 4 quadrant (4Q)-PMD-pixels. If the pixels themselves are square then the pixel element composed of the four quadrants is also square and by phase shift of modulation as between diagonally mutually opposite pixels it is possible simultaneously to detect the push-pull correlation values of the in-phase and quadrature signals.

In addition a further embodiment of the invention is preferred in which arranged over the modulation photogates and the accumulation gates are corresponding strip-shaped lenses, specifically therefore cylindrical lenses, which focus the light impinging on the lenses on to the modulation photogates so that the surface components which are occupied by the non-photosensitive accumulation gates also still effectively contribute to the light yield. If the coupled-in modulated light is relatively narrow-band in nature, the strip structure can be so dimensioned for a mean wavelength of such light that the coupling-in factor, in accordance with the wave theory, is markedly greater, or the reflection factor is markedly smaller, than corresponds to the reflection factors in accordance with geometrical optics. In that case it is possible to involve an improvement in the modulation photogates and to promote such a measure.

A plurality of pixels can either be connected together to form a linear array or a matrix array, in which respect a preferred embodiment is one in which arranged over the individual pixels are microlenses which direct the incident light which in part is also directed on to regions which are between the pixels and do not contribute to evaluation through the microlenses on to the photosensitive pixel surfaces.

A 4Q-PMD-pixel, with four times the same or with differing modulation, can measure the points of concentration of the four square sub-pixels and at the same time ascertain the overall phase or transit time of the 4Q-PMD-pixel by averaging of all 4 correlation values. The four individual concentration point transit times supply in that case the gradient or normal vector of the imaged surface element and permit improved interpolation of the 3D-surface to be measured, between the adjacent pixels of an array.

Finally a particularly preferred embodiment of the invention is one in which the pixels, that is to say the individual modulation photogates and the accumulation gates are implemented using CMOS-technology. That is a very inexpensive and well-established technology which permits mass production of corresponding elements and at the same time also allows on-chip and multi-chip module integration of the peripheral electronics such as the evaluation electronics and the modulation electronics.

In CMOS-technology both conventional CMOS-pixels with 2D-functionality (so-called 2D-pixels) and also PMD-pixels with 3D-functionality (so-called 3D-pixels) can be integrated in a linear array or in a matrix array in a mixed configuration. In this case the various, in particular adjacent items of pixel information can be evaluated in a downstream-disposed, data-fusioning and interpolating apparatus, in terms of rapid reconstruction of the complete 3D-color/depth image by means of the items of color information of the 2D-pixels and the 3D-depth and 2D-gray value information of the 3D-PMD-pixels, which affords totally new options in regard to optical measurement procedures and in automation, object identification, security technology and multi-media technology.

BRIEF DESCRIPTION OF THE DRAWINGS:

Further advantages, features and possible uses of the present invention will be apparent from the description hereinafter of preferred embodiments and the accompanying drawings in which.

DETAILED DESCRIPTION OF THE INVENTION

Figure 1:
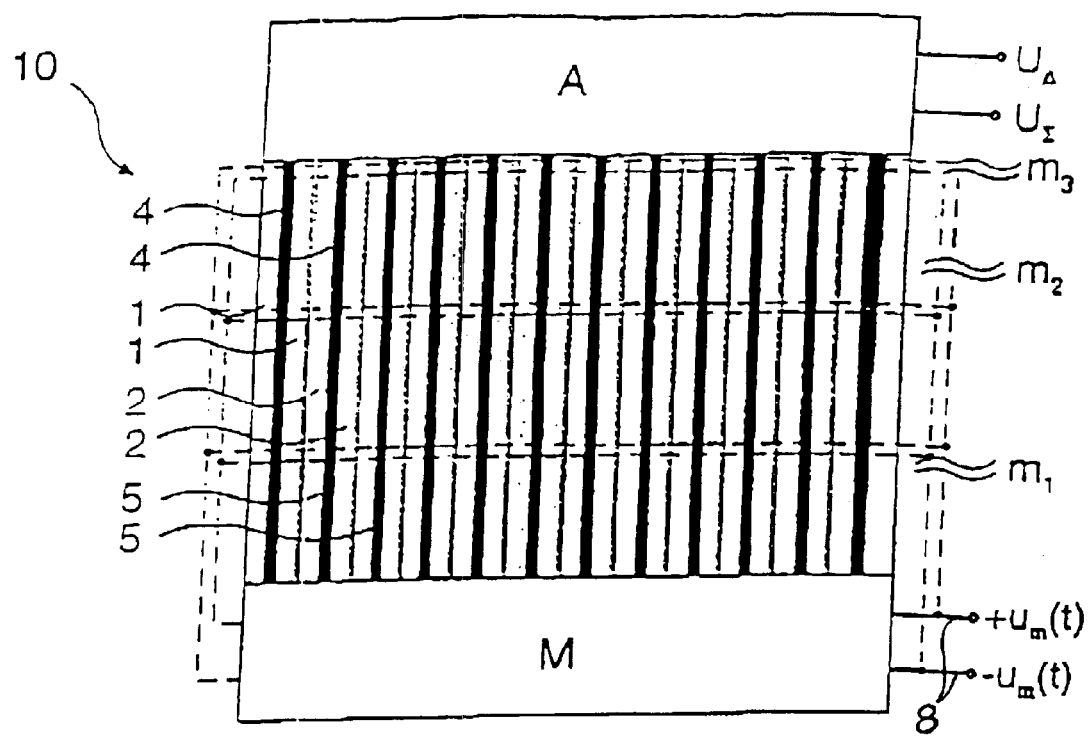
FIG. 1 is a plan view of a pixel of a first embodiment of the present invention.

Shown in the middle part of FIG. 1 is a row of parallel vertical strips, wherein the light strips reproduce photosensitive, semitransparent modulation photogates while the dark strips which are identified by references 4 and 5 correspond to light-opaquely covered accumulation gates or reading-out gates. The narrow black vertical strips represent insulating separating-surfaces between adjacent modulation photogates 1 and 2.

The modulation photogates are here distinguished by references 1 and 2 because the modulation photogates denoted by the same reference 1 are also modulated in push-pull relationship with each other while the potential of the modulation photogates which in turn are denoted by reference 2 which is the same in relation thereto are modulated in push-pull relationship with the modulation photogates 1. M in the lower part diagrammatically indicates the modulation circuit, in particular the modulation electronics and connections or terminals 8 of the modulation voltage supply. A in the upper part of FIG. 1 diagrammatically shows the reading-out circuit, in particular the reading-out electronics and connections or terminals and a signal processing arrangement connected to the accumulation gates 4 and 5 respectively. In this case, all accumulation gates 4, that is to say every second accumulation gate, is connected to a first common reading-out line and the accumulation gates 5 disposed therebetween are connected to another common reading-out line. The reading-out circuit ascertains the sum signal $U_\Sigma$ and also the difference U from the photocharges of the accumulation gates 4 and 5. $U_\Sigma$ is a measurement in respect of the sum of the total photocharges which are averaged in respect of time while U is a measurement in respect of the difference of the photocharges at the accumulation gates 4 and 5 or $K_+$ and $K_-$ respectively. The modulation photogates 1 are for example connected to the voltage terminal $+U_m(t)$ when the modulation photogates 2 are connected to the voltage terminal $-U_m(t)$. The modulation voltage is preferably a pseudo-noise voltage or also a pseudo-random voltage, but it would also be possible to use any other encoded modulation signal with a suitable narrow correlation function and an adequate word length.

Figure 3:
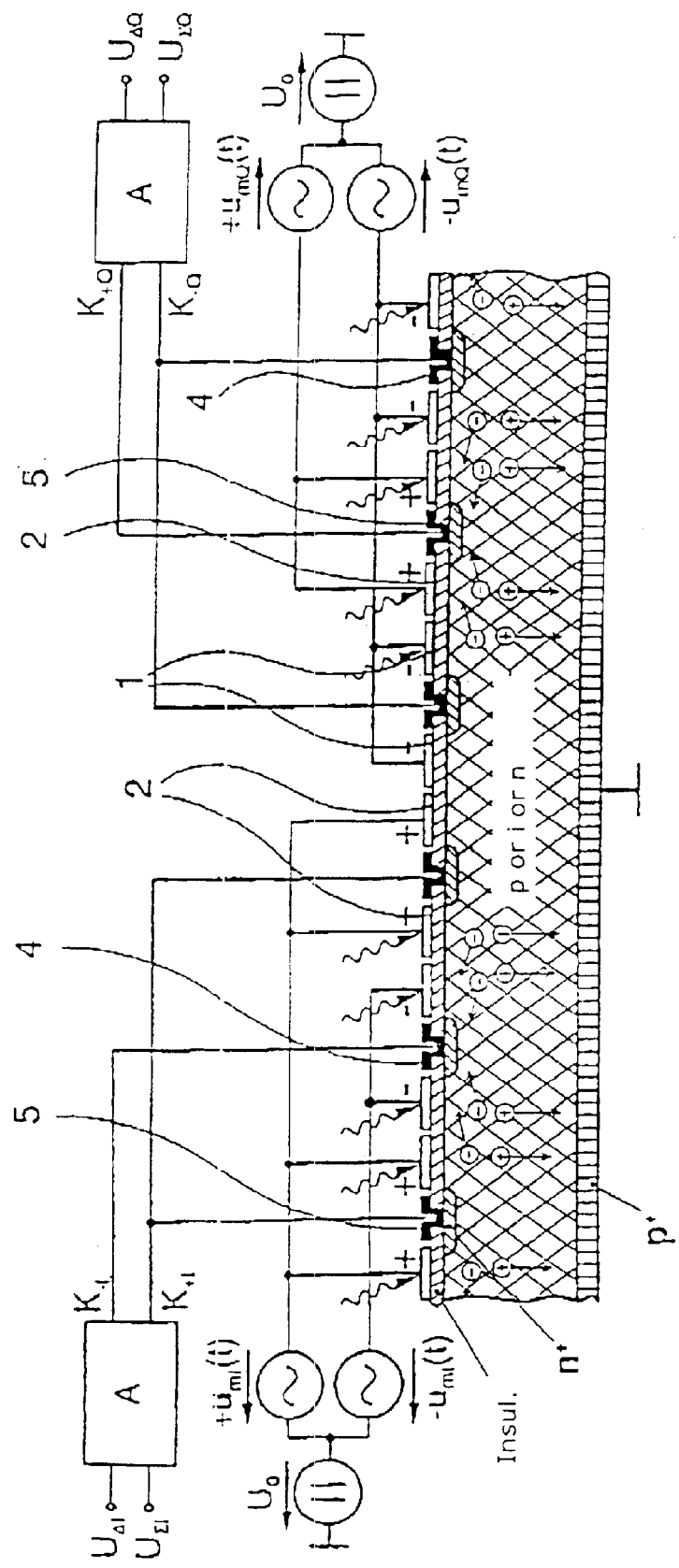
FIG. 3 shows a portion from a view in cross-section through the pixel elements shown in FIG. 2, in a section taken along line III—III in FIG. 2.
Figure 4:
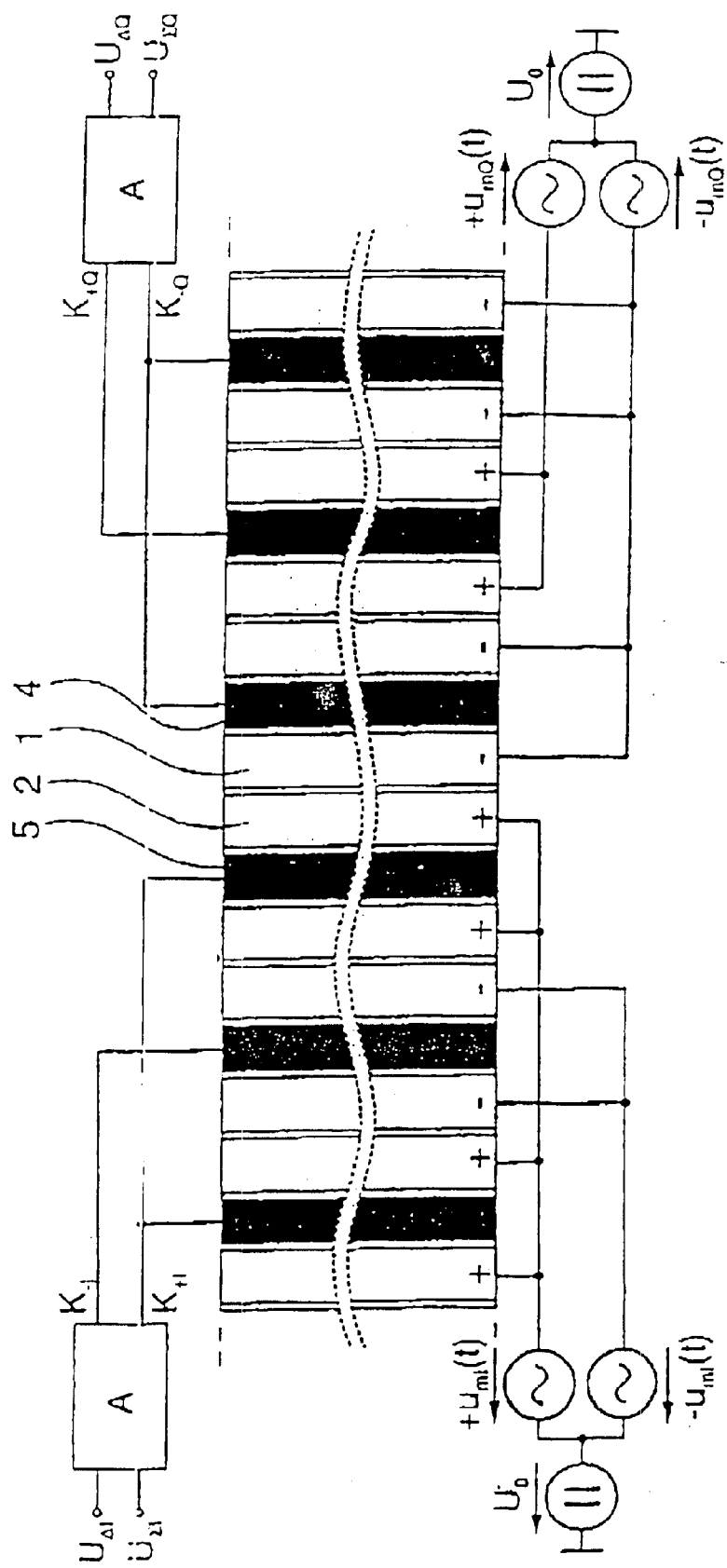
FIG. 4 is a plan view on an enlarged scale of a portion of the double pixel or 2-quadrant pixel shown in FIG. 2.

If the modulation photogates 1 are at a low voltage level while the modulation photogates 2 are at a high voltage level the charge carriers, being photoelectrons in the embodiment of FIGS. 3 and 4, are passed predominantly or almost exclusively only to the accumulation gates 4 while the accumulation gates 5 collect no or almost no charges. If the voltage conditions are reversed and the modulation photogates 1 are therefore at high potential while the modulation photogates 2 are at low potential, then the charge carriers flow away almost exclusively by way of the accumulation gates 5. In the event of the charge carriers produced involving a substantial variation in respect of time which is produced by illumination, varying with the same function, of an object whose image is recorded by the pixel, that also affords information about the moment in time at which the charge carriers were produced on the photosensitive surfaces. Modulation of the modulation photogates with the same modulation function as that with which illumination of the object is also modulated then furnishes as the signal U the correlation function which contains the items of information relating to the distance of the imaged pixel.

As will be seen, the strips are very narrow in comparison with their length, in which respect the corresponding conditions are not shown true to scale in the Figures. On the contrary, in practice the individual strips are even substantially longer in relation to their width. The narrow strips correspond to a very short gate length, that is to say a very short drift distance for charge carriers which are produced under a modulation photogate 1 or 2, to one of the reading-out gates 4 or 5. The correspondingly short drift times permit corresponding fast modulation signals and therefore result in a high band width.

In order however not to have an adverse effect on the level of measurement accuracy by virtue of the resistance of the modulation photogates in their longitudinal direction, a plurality of modulation connections or terminals $m_1$, $m_2$ and $m_3$ are respectively connected in parallel at equal spacings with respect to each other preferably from the top side of the pixel to the respective modulation photogates 1 and 2 so that modulation can be effected simultaneously at the respective connecting points of the connecting lines $m_1$, $m_2$ and $m_3$, in which respect it will be appreciated that the number of said connections can be varied and adapted according to the requirements and according to the length of the individual strips.

Alternatively or in addition, this problem can be resolved if the modulation photogates directly adjoining the accumulation gates 4, 5, on the side of the strip which is towards the accumulation gates, in part involve a strip-shaped covering of for example between a quarter and a third of the modulation photogate width, by means of a contacting strip of high conductivity and of no or very slight transparency for the electromagnetic waves, preferably in the form of a metal film applied to the modulation photogate, that measure being adapted to focusing of the light in the pixel region by the cylindrical lenses according to the invention.

In addition the modulation photogates 1 and 2 may also directly involve an end connection from the block identified by M at the bottom.

Figure 2:
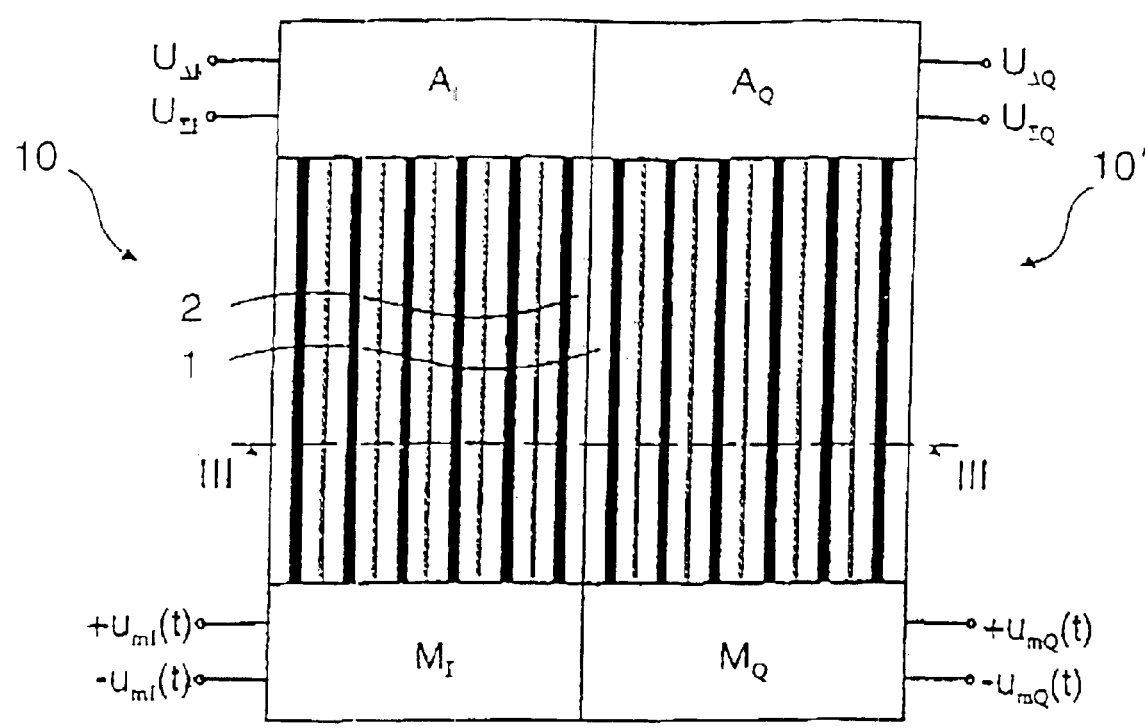
FIG. 2 shows the interconnection of two adjacent pixels.

FIG. 2 diagrammatically shows a pixel which is composed of two identical pixel elements 10, 10' which are each only of half the width in comparison with the pixel element 10 shown in FIG. 1. For the sake of clarity the additional modulation connections $m_1$, $m_2$ and $m_3$ are not shown herein but could obviously also be present.

The two strip fields of these pixels 10, 10' are arranged in directly mutually juxtaposed relationship so that two individual modulation photogates 2 and 1 respectively are disposed in mutually juxtaposed relationship in the center at the interface between the two pixels 10, 10'. Each of the pixels 10, 10' has its own modulation voltage supply and also its own reading-out circuit and its own reading-out lines. If the modulation voltages of the pixel 10' are applied in relation to those of the pixel 10 in such a way that the strip 2 of the pixel 10 is modulated in push-pull relationship with the strip 1 of the pixel 10', the two pixel elements cooperate just like the larger pixel 10 of FIG. 1 illustrated above. It is however also possible to choose the modulation voltage of the pixel 10' as being phase-shifted through 90° relative to the modulation voltage of the pixel 10, which corresponds to an in-phase and a quadrature signal.

Accordingly here the individual voltages, and the modulation and the evaluation circuit are additionally identified by the index I for 'in-phase' and the corresponding circuits and voltage symbols of the pixel 10' are identified by the additional index Q for 'quadrature'.

FIG. 3 diagrammatically shows a specific physical structure of the double pixel illustrated in FIG. 2. It will be seen that this double pixel is disposed on a common substrate and that the arrangement and sequence of the individual modulation photogate layers, insulating layers and accumulation gate layers does not differ from the arrangement which would also be involved in the case of the larger pixel shown in FIG. 1. Only the electrical connections are completely separated from each other for the right-hand and left-hand pixel halves so that it is possible for modulation of the modulation photogates arranged in the right-hand half to be selected independently of modulation of the modulation photogates arranged in the left-hand half, which, as already mentioned, permits separation of the signals into in-phase and quadrature signals and enhances the versatility of the PMD-pixel.

FIG. 4 is simply a plan view which essentially also corresponds to the plan view in FIG. 2, but the individual strip elements are illustrated as being interrupted in terms of their length in order to be able to show the overall arrangement on an enlarged scale, while the individual connections of the modulation photogates to the modulation circuit and also the connections of the reading-out circuits to the accumulation gates 4 and 5 are additionally illustrated in detail.

Figure 5:
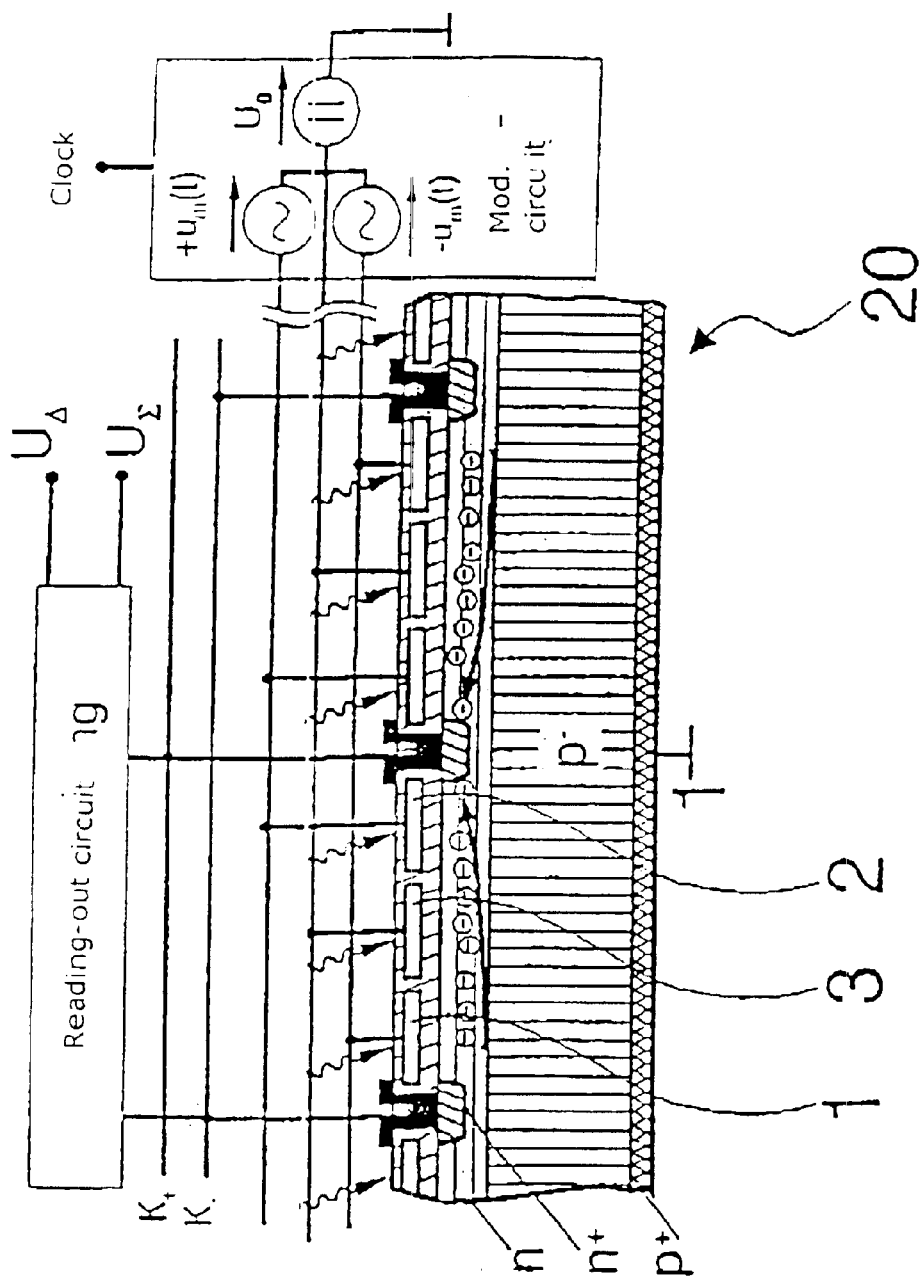
FIG. 5 is a view in section transversely to the strip direction through a pixel in another embodiment of the present invention with in each case three modulation photogates between two respective accumulation gates and a buried n-layer and with modulation photogate electrodes embedded in the insulating material.
Figure 6:
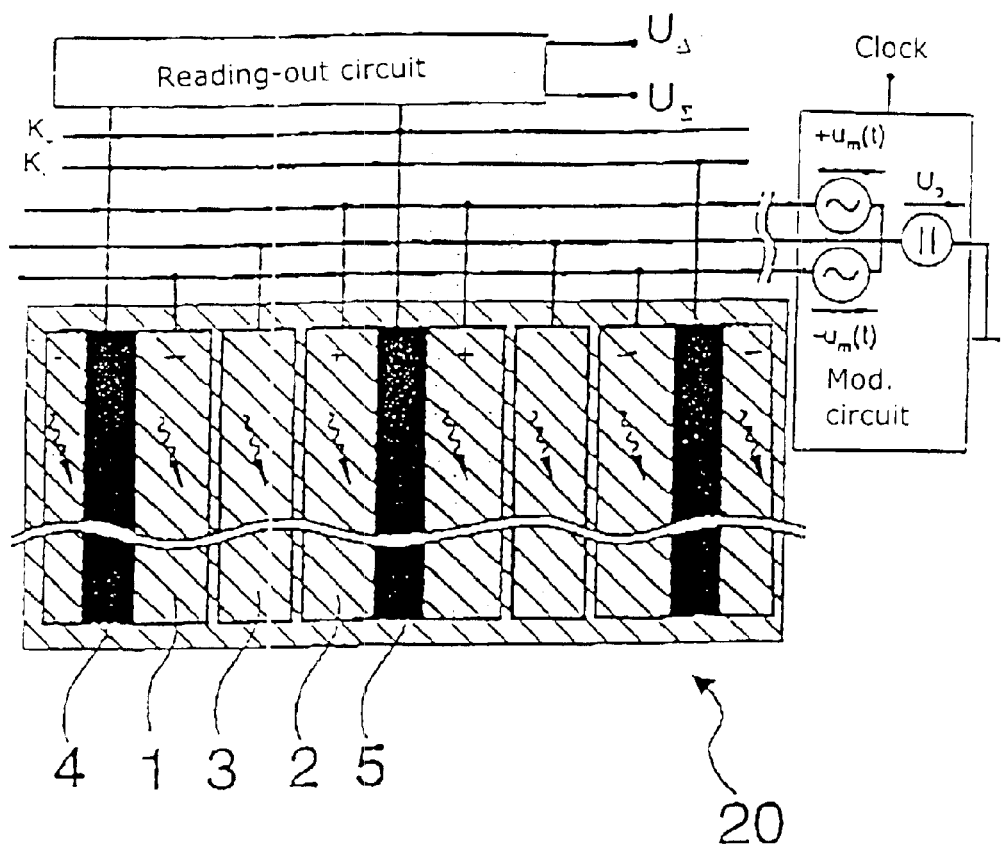
FIG. 6 is a plan view of the 3-gate structure of a PMD-pixel in a multi-strip technology as shown in FIG. 5 in a view corresponding to FIG. 4.
Figure 7:
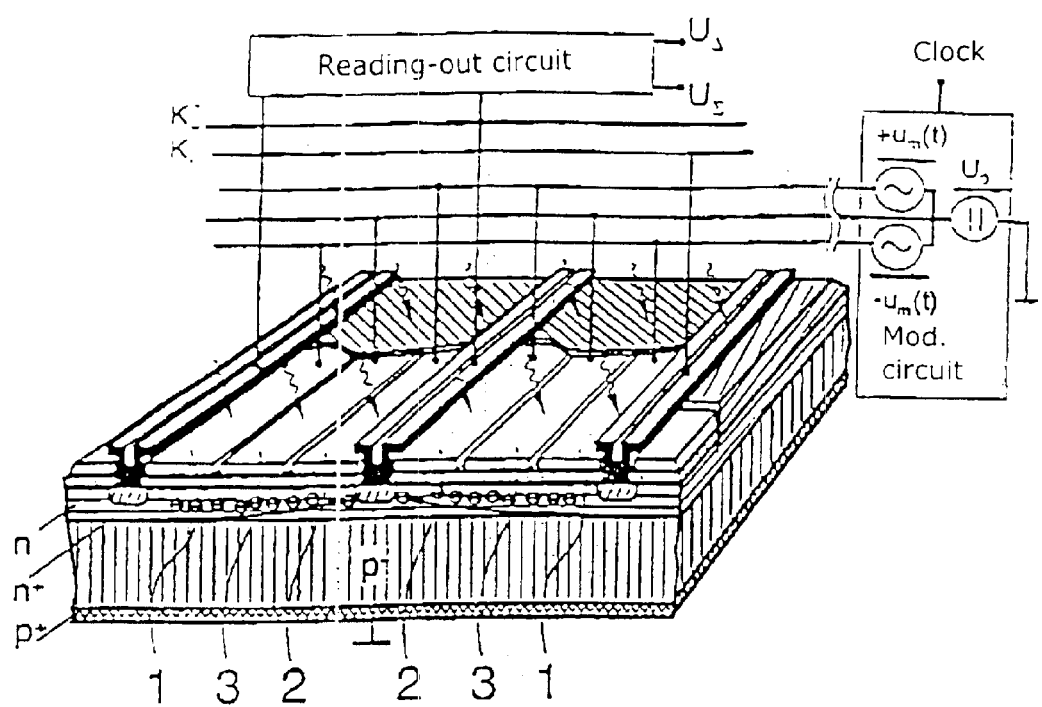
FIG. 7 is a perspective view of a portion of the pixel shown in FIGS. 5 and 6.

FIGS. 5 through 7 show a further alternative embodiment of the invention, in which a further modulation photogate 3 is also additionally provided between the modulation photogates 1 and 2, as have already been described with reference to FIGS. 1 through 4. In this case the circuit symbols at the right in each of FIGS. 5 through 7 indicate that this central modulation photogate is held at a constant potential and relative thereto the modulation photogates 1 and 2 are increased and reduced in their potential in accordance with the modulation function. That results in a generally flattened potential configuration and a still better channel separation effect, a higher drift speed and a lower level of modulation power.

In this respect, FIG. 5 is a view in section similarly to FIG. 3, but without the pixel 20 in this case being divided into a plurality of portions. FIG. 5 illustrates an advantageous configuration with a buried n-layer and with modulation gate electrodes which are embedded in the insulating material, which is advantageous for very small structures, in comparison with overlapping gate structures. FIG. 6 shows a view of the PMD-pixel 20 from above similarly to FIG. 4 and FIG. 7 shows a perspective view of this photomixing detector PMD.

Figure 8:
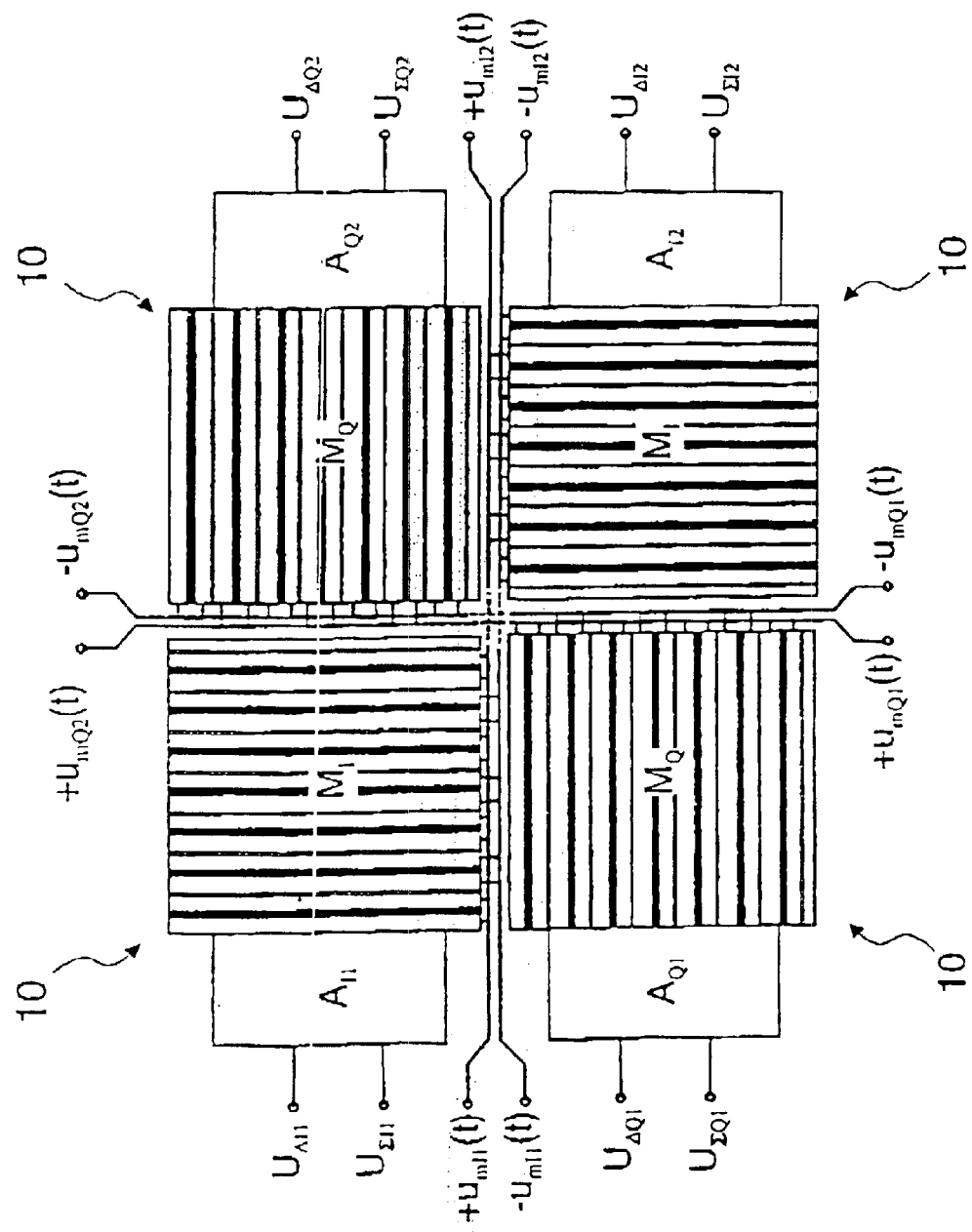
FIG. 8 shows four pixel elements which are connected together with different strip orientations and which form a pixel unit for various modes of operation.

FIG. 8 shows four pixel elements which are composed of strip-shaped modulation photogates and accumulation gates and which are each of a substantially square shape and which are assembled to form a pixel which is once again square overall, wherein the strips in the quadrants which are arranged in diagonal relationship with each other respectively extend parallel to each other while they extend perpendicularly to each other between adjacent quadrants. That substantially suppresses mutual overcoupling and falsification of different adjacent modulation signals. In that arrangement the evaluation circuits are moved to those sides of the square which can be arranged outside the square pixel surface. In this case also modulation of the modulation photogates is preferably again effected with a modulation voltage signal which, for two quadrants in mutually diagonal relationship, relative to the other two diagonally arranged quadrants, is phase-shifted through 90° or is delayed by a chip width $T_{chip}$ in the case of PM-modulation, which in turn results in simultaneous measurement of in-phase and quadrature signals. The modulation voltage lines which overlap at the center can be closed for 1-quadrant operation, for 2-quadrant operation they can be only-horizontally and vertically connected and for separate 4-quadrant operation they can be open. It is however also advantageous, in the situation involving 4 identical modulation signals and thus preferably connected lines, to provide for reading-out separately four times. The required IQ-value pairs for transit time determination can also be ascertained in a time multiplex manner in the 1-quadrant mode of operation. In the alternative heterodyne process the 4 correlation functions can pass through, with the beat frequency, and in that way the items of spacing information can be ascertained.

Figure 9:
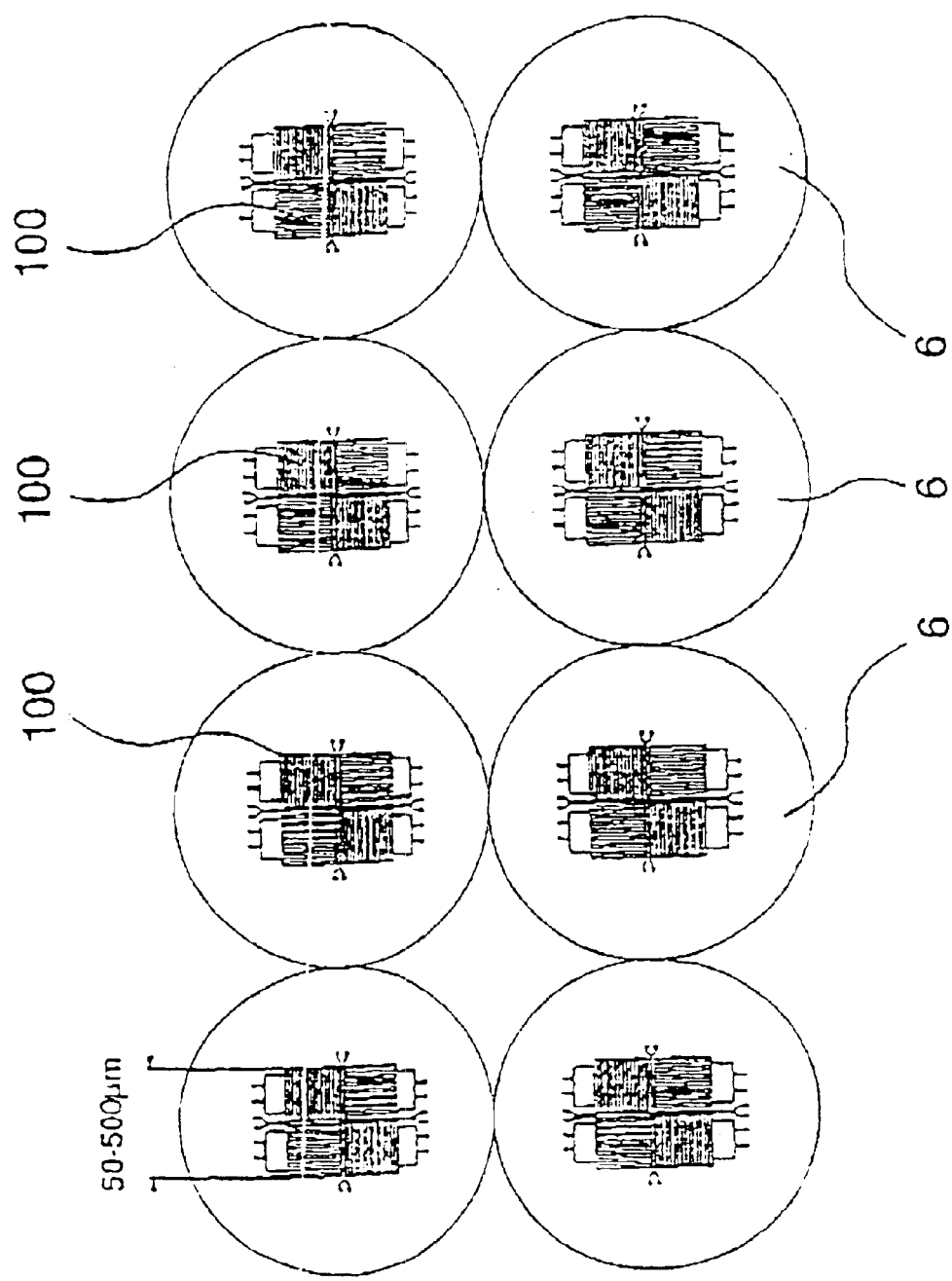
FIG. 9 shows a field comprising 2×4 pixels as shown in FIG. 8, FIG. 10 diagrammatically shows the mode of operation of a 3D-camera which is constructed from a relatively large field of pixel elements similarly to FIG. 9.

FIG. 9 shows a panel or field of 2×8 pixels of the kind shown in FIG. 8. Arranged over each of those pixels which are here generally denoted by reference 100 is a microlens 6 which serves to focus the light impinging on the surface covered by the entire pixel field substantially on to the actual photosensitive surfaces of the pixels. The drawing does not show strip lenses which are arranged extending parallel to the strips on the individual pixels and which cover the entire pixel surface in such a way that the light impinging on the strip lenses is concentrated only on to the regions between the accumulation gates, that is to say only on to the modulation photogates.

Figure 10:
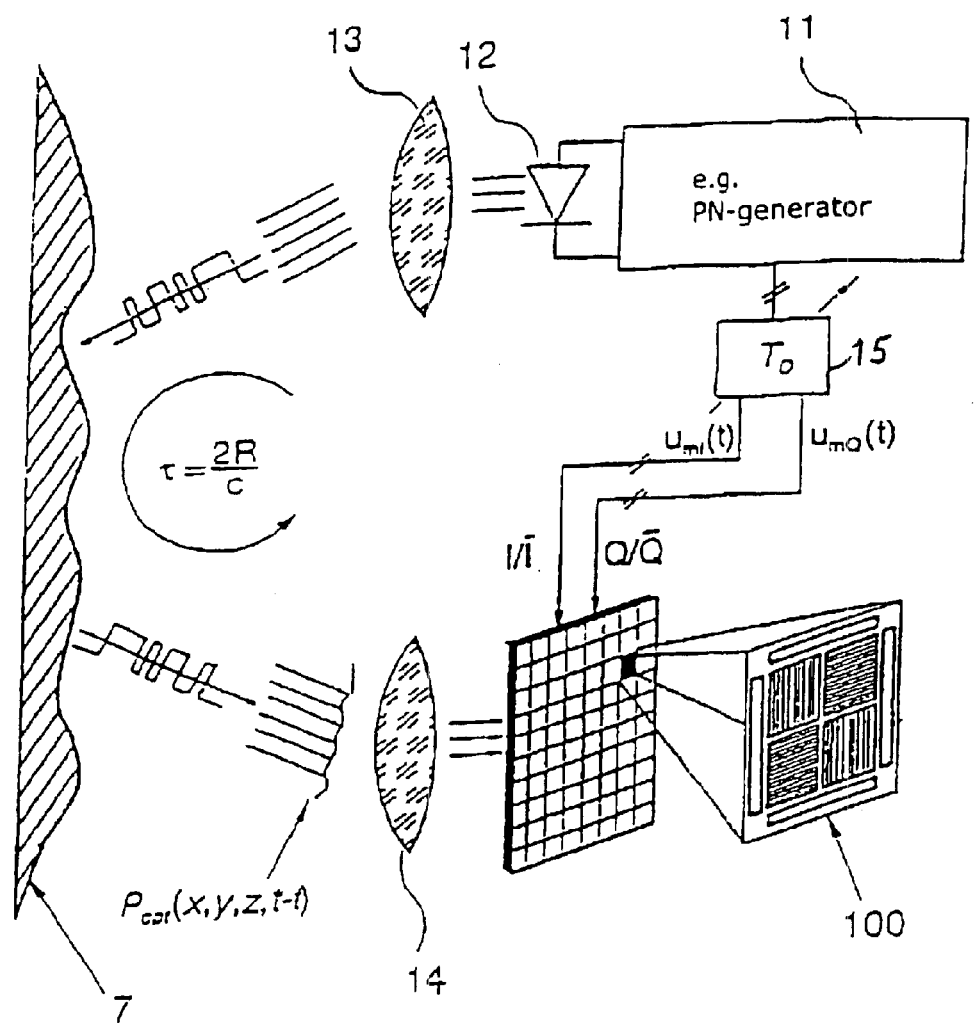

FIG. 10 shows the principle of a 3D-camera equipped with the pixels 100 according to the invention. A generator 11, in this example a PN (pseudo noise) generator, controls an optical transmitter, here a laser diode 12 whose light is projected by way of an optical device 13 on to the surface of an object 7. In this case, the light intensity is modulated with the modulation signal of the generator 11. The correspondingly reflected and likewise modulated light is projected by way of a camera optics 14 on to an array of image pixels 100 which in particular can be in the form of the pixels or photomixing elements shown in FIG. 8.

They are modulated with a delay member 15 with an adjustable time delay $T_D$ for the I-output and an additional fixed time delay $T_{chip}$ for the Q-output with the same modulation signal from the PN-generator 11 as also the diode 12, but in push-pull relationship. The modulated received light signal is therefore correlated twice per pixel with the same modulation function by means of the modulation photogates so that that entails transit time information and thus also spacing information of individual elements of the surface of the object 7.

In the case of the configuration according to the invention, in the form of long narrow strips, those items of depth information are no longer misinterpreted by virtue of light-dark boundaries on the surface of the object 7.

Figure 11:
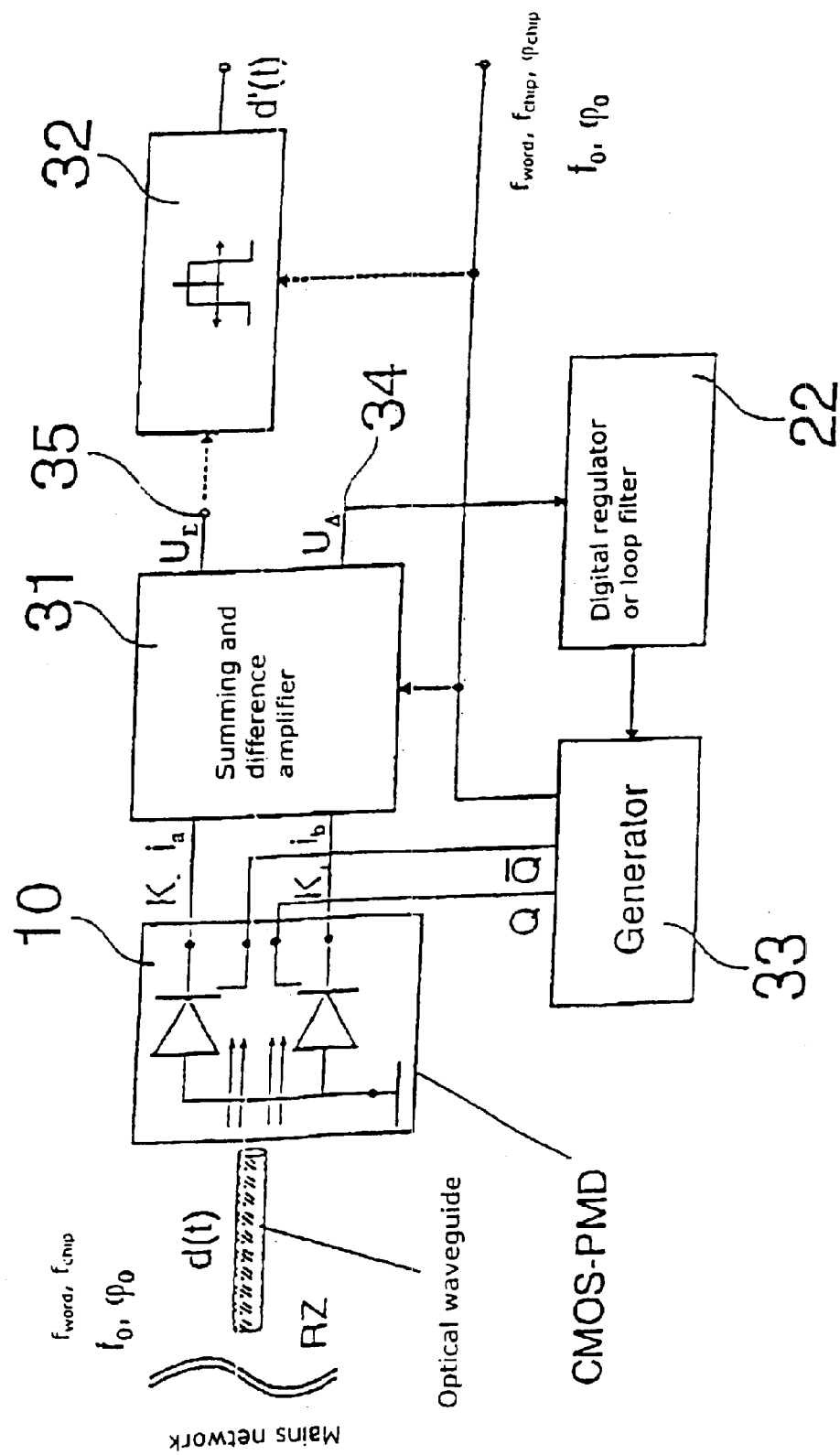
FIG. 11 shows an optical PLL-circuit or DLL-circuit on a PMD basis for light barriers, time lapse or delay cameras and data light barriers with optional data signal regeneration.
Figure 12:
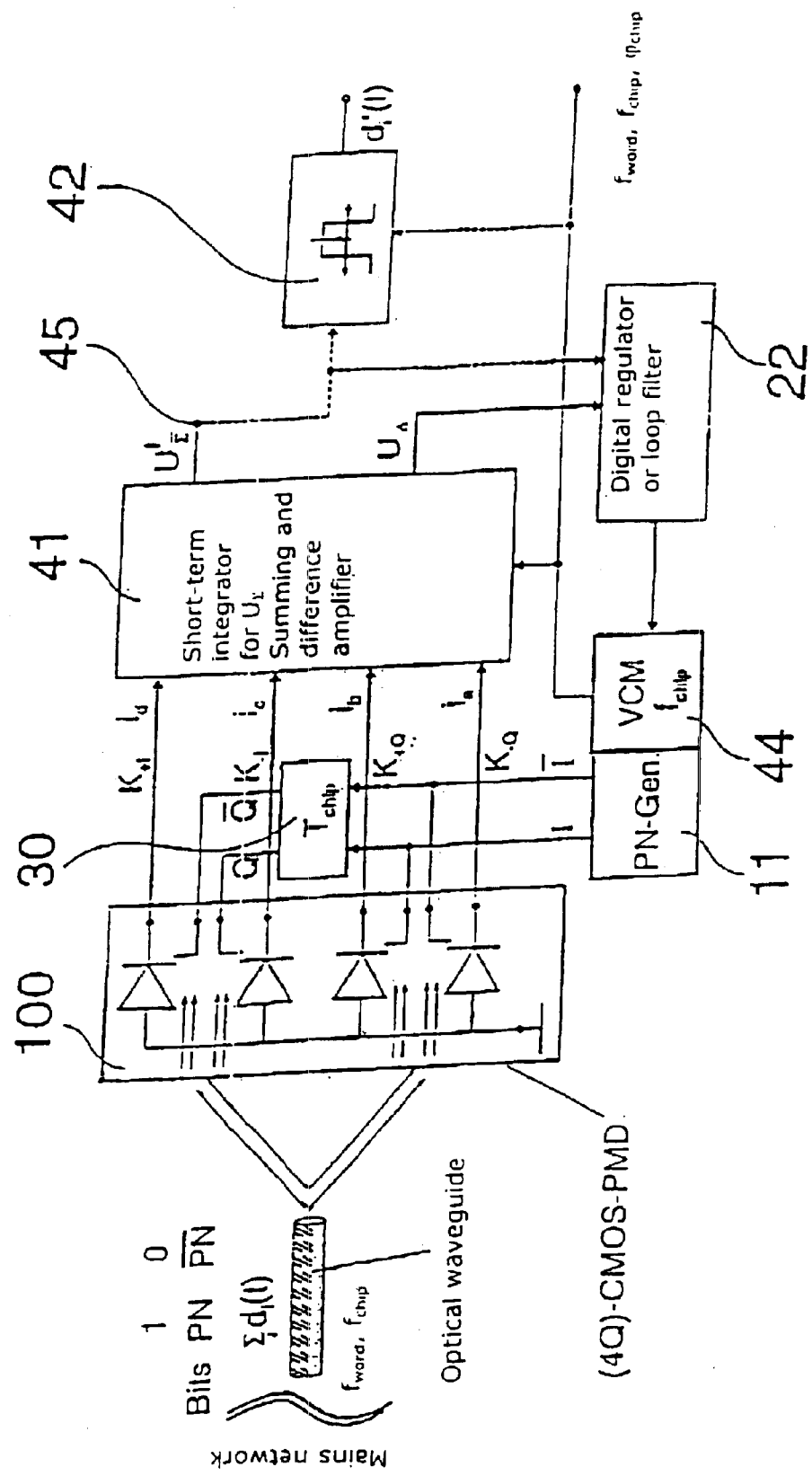
FIG. 12 shows a login amplifier circuit for measuring in-phase and quadrature signals and signals with band spread technology in particular for high-sensitivity data light barriers, for phase transit time measurements and for optical data transmission preferably in optical CDMA (Code Division Multiple Access) systems and with optional data signal regeneration.

FIGS. 11 and 12 show the use of corresponding PMD-elements in the highly sensitive reception of optical signals by means of phase regulating circuits, PLL and DLL.

FIG. 11 shows an optical PLL-circuit or DLL-circuit with a PMD-pixel 10 as electrooptical mixing element which has a very high level of sensitivity as can advantageously be used in light barrier arrangements, as a PLL-array in time-lapse cameras, in optical remote controls and in data light barrier assemblies as well as for the regeneration of data signals in optical communications. An optical PMD-PLL can be highly integrated as the usual reception -HF-amplifier which is connected downstream of the photodiode and the electronic mixer are completely eliminated because the photomixing detector PMD with the reading-out circuit 31 at the output 34 already provides the mixed product in the low frequency range in the form of a low pass-filtered difference signal $U_A$−const·$(i_a-i_b)$. The phase regulating circuit is connected by way of a loop filter or a digital regulator 22.

It can be used for many modulation modes, for example for sine, rectangular, frequency, phase modulation and for code multiplexing, for example PN-encoding. In that case the voltage-controlled generator 33 is set to the clock rate and modulation to be received. When the phase regulating circuit is latched data signals which in the case of the wide-band PMD according to the invention occur at a wide-band sum output 35 of the reading-out circuit 31 or by way of a wide-band photodiode with amplifier, which is operated in parallel with the same optical data signal, can be regenerated with a 1/0-decision element 32 by virtue of clock recovery of that kind. For that purpose the optical 1/0-data signals are preferably encoded as return-to-zero (RZ)-signals.

FIG. 12 shows a 2Q-PMD-DLL with which even higher levels of sensitivity can be achieved on the basis of an IQ-PMD-receiver, in particular with PN-modulation 11.

As in the above-mentioned patent applications to the same applicant, which form the basis for this patent application, periodic PN-modulation 11 affords great advantages in terms of PMD-reception, in particular the possibility of multi-channel selectivity, multi-target detection and the highest degree of sensitivity in respect of phase transit time resolution. In accordance with the invention it is also possible to use PN-encoded data signals for data light barrier arrangements inclusive of distance measurement and for optical CDMA-data transmission, for example, as shown in FIG. 12. In that respect for example a logic '1' corresponds to a normal PN-word whereas a logic '0' corresponds to the inverted PN-word=$\overline{PN}$, that is to say the light/dark chips are interchanged. In contrast to FIG. 11, in FIG. 12 the outputs from the summing and difference amplifier 41 are both connected to the loop filter 22 which then feeds the VCM $f_{chip}$ 44 connected to the PN-modulation generator 11. It is the difference output voltage that is formed as the difference of the quantitative differences of the photocurrents: $U_A$=const·$(|i_a-i_b|-|i_c-i_d|)$. By means of the recovered word clock it is possible to regenerate the data signal of the PN-encoded 1/0-data sequence by a procedure whereby in the summing amplifier the sum 45 of the differences of the photocurrents $U_\Sigma$=const·$(|i_a-i_b|-|i_c-i_d|)$ is respectively formed by way of a PN-word length by means of a short-term integrator contained in the summing amplifier 41 and in the 1/0-decision element 42 the 1/0-decision is taken in clock-synchronous manner for subsequent evaluation or regeneration.

With a VCO providing a sine modulation for the modulation 11 voltage and with the circuit element 30 where $T_{chip}$=T/4 of the sine period, it is also possible to detect and regenerate vector modulation.

What is claimed is:

1. An apparatus for detecting the phase and amplitude of electromagnetic waves, comprising at least two modulation photogates (1, 2) which are sensitive to the electromagnetic waves (photosensitive), and accumulation gates (4, 5) which are associated with the modulation photogates, said accumulation gates (4, 5) being not photosensitive, and electrical connections for the modulation photogates (1, 2) and the accumulation gates (4, 5), so that the latter can be connected to a reading-out device, and the former can be connected to a modulating device which increases or reduces the potential of the modulation photogates (1, 2) relative to each other and relative to a potential of the accumulation gates (4, 5) corresponding to a desired modulation function, characterized in that there are provided a plurality of modulation photogates (1, 2) and accumulation gates (4, 5) being formed of long narrow parallel strips which group-wise form a PMD-pixel, wherein the accumulation gates are reading-out diodes, wherein the accumulation gates of a (PMD-) pixel are divided into at least two groups of accumulation gates, each group being connected to a common readout line and means are provided for determining the difference of the signals received from the readout lines of the said at least two groups of accumulation gates.

2. Apparatus as set forth in claim 1, characterized in that the width of the modulation photogates is greater than the width of the accumulation gates.

3. Apparatus as set forth in claim 2 characterized in that the width of the modulation photogates is of the order of magnitude of a wavelength and charachterized in that, for the remote infrared range, the width of the modulation photogates is of an order of magnitude less than the wavelength of the electromagnetic waves to which the modulation photogates are sensitive.

4. Apparatus as set forth in any one of claims 2 and 3 characterized in that the apparatus provides an optical PLL- or DLL-circuit with a 2Q-PMD-DLL on the basis of an IQ-PMD-receiver, with PN-modulation, wherein digital PN-encoded data signals are used for multi-channel selection, multi-target detection and for highest sensitivity in phase transit time resolution, wherein a difference output voltage is formed as a difference of quantitative differences of photocurrents as $U_{66}$=const·$(|i_a-i_b|-|i_c-i_d|)$ and is fed back by way of a loop filter or a digital regulator as a control parameter of a voltage-controlled multivibrator to a chip frequency and wherein a data signal of a PN-encoded 1/0-data sequence is regenerated by means of a recovered word clock by a procedure whereby in a summing amplifier (41) a sum of the differences of photocurrents as $U_\Sigma$=const·$(|i_a-i_b|+|i_c-i_d|)$ respectively formed over a PN-word length by means of a short-term integrator contained in the summing amplifier.

5. Apparatus as set forth in one of claims 2 through 3 characterized in that a strip length of the modulation photogates (1, 2) and the accumulation gates (4, 5) is more than fifty times the wavelength of the electromagnetic waves to which the modulation photogates are sensitive.

6. Apparatus as set forth in claim 2 further characterized wherein said accumulation gates (4, 5) are of photosensitive material which is shaded.

7. Apparatus as set forth in one of claims 2, 3, and 6 characterized in that a strip length of the modulation photogates (1, 2) and the accumulation gates (4, 5) is more than ten times the wavelength of the electromagnetic waves to which the modulation photogates are sensitive.

8. Apparatus as set forth in one of claims 2, 3, and 6 characterized in that there are provided a plurality of modulation photogates in paired parallel mutually juxtaposed relationship, wherein each of the modulation photogates (1, 2) of such a pair is connected to another modulation connection so that the modulation photogates (1, 2) are modulatable in push-pull relationship, wherein a respective accumulation gate (5, 4) is arranged between a pair of modulation photogates (1, 2) and a next adjacent further pair of modulation photogates (2, 1) and wherein the modulation photogates (1, 2) of the two pairs, which are immediately adjacent to a respective accumulation photogate (4, 5), are connected or electrically joined to the modulation connections in such a way that their modulation occurs respectively in push-pull mode.

9. Apparatus as set forth in one of claims 2, 3, and 6 characterized in that a plurality of modulation connections ($m_1$, $m_2$, $m_3$) are arranged at substantially equal spacings along the length of the strips and are connected to the modulation photogates (1, 2).

10. Apparatus as set forth in one of claims 2, 3, and 6 characterized in that the modulation photogates immediately adjoining the accumulation gates (4, 5), on a side towards the accumulation gates, include a contacting strip of high conductivity and of no or very low transparency.

11. Apparatus as set forth in one of claims 2, 3, and 6 characterized in that the apparatus has one or more pixel units, wherein each pixel unit is substantially square-shaped and comprises a plurality of strip-shaped modulation gates (1, 2) and accumulation gates (4, 5), which pixel units are assembled to form a pixel, wherein the strip directions of adjacent pixel units are perpendicular to each other, wherein adjacent pixel units are at different modulation voltages, and wherein transversely with respect to the strip direction of a respective pixel unit the ends of the strip-shaped modulation gates are defined by at least one respective modulation photogate (1, 2) which adjoins a next accumulation gate (4, 5).

12. Apparatus as set forth in claim 11 characterized in that the electrical connections for the accumulation gate are provided at a respective end of the strips of a pixel, wherein each second accumulation gate is connected to a first respective one of two reading-out lines (corresponding to K+) and the other accumulation gates are connected to the respective other one of the connection lines (corresponding to K−), wherein the reading-out lines lead to an evaluation circuit.

13. Apparatus as set forth in claim 11 characterized in that two pixel units (10, 10') are arranged with their strips parallel and in directly mutually juxtaposed relationship so that mutually immediately adjacent modulation photogates which define mutually juxtaposed ends or sides of the two pixel units (10, 10') form a pair of modulation photogates (1, 2) which are modulatable selectively in push-pull mode or phase-displaced relationship, whereby either a single pixel element of double the size of one of the two pixel units is formed or two independent measurement procedures, being of an in-phase signal and a quadrature signal, are possible with the two pixel units.

14. Apparatus as set forth in claim 13, characterized in that the apparatus provides an optical PLL- or DLL-circuit with a 2Q-PMD-DLL on the basis of an IQ-PMD-receiver, with PN-modulation, wherein digital PN-encoded data signals are used for multi-channel selection, multi-target detection and for highest sensitivity in phase transit time resolution, wherein a difference output voltage is formed as a difference of quantitative differences of photocurrents as $U_\Delta = \text{const} \cdot (|i_a - i_b| - |i_c - i_d|)$ and is fed back by way of a loop filter or a digital regulator as a control parameter of a voltage-controlled multivibrator to a chip frequency and wherein a data signal of a PN-encoded 1/0-data sequence is regenerated by means of a recovered word clock by a procedure whereby in a summing amplifier (41) a sum of the differences of photocurrents as $U_\Sigma = \text{const} \cdot (|i_a - i_b| + |i_c - i_d|)$ is respectively formed over a PN-word length by means of a short-term integrator contained in the summing amplifier.

15. Apparatus as set forth in claim 11 characterized in that there are four pixel units arranged in a rectangle, wherein the strips of pixel units which are respectively disposed in diagonally opposite relationship in the rectangle extend parallel to each other, while the strips of immediately adjacent pixel units extend perpendicularly to each other, and wherein modulation connections are connected in such a way that modulation of adjacent pixel units (10) can be effected in phase-shifted relationship through 90°.

16. Apparatus as set forth in claim 15 characterized in that each of the four pixel units (10) is respectively of a substantially square shape and the four pixel units are assembled to form a square.

17. Apparatus as set forth in claim 16 characterized in that the four pixel units are selectively combined individually (4-quadrant operation) or doubly in diagonal relationship (2-quadrant operation) or in quadruple relationship (1-quadrant operation), wherein in the case of 4-quadrant operation and 2-quadrant operation the gradient or normal vector of the surface of the four pixel units is additionally evaluated.

18. A method of operating an apparatus as set forth in claim 11 characterized in that a scene of which an image is to be produced is illuminated with a light modulated in accordance with a modulation function, wherein the modulation photogates (1, 2) are modulated with bipolar or push-pull modulation function and wherein, selectively for half of a 2-quadrant or 4-quadrant pixel, of the pixels 90° phase shifted_modulation is effected in the case of sine modulation or a bit width in the case of rectangular modulation or a chip width in the case of PN-modulation of the modulation photogate potentials, wherein the accumulation gates of a (PMD-) pixel are divided into at least two groups of accumulation gates, each group being connected to a common readout line and means are provided for determining the difference of the signals received from the readout lines of the said at least two groups of accumulation gates.

19. Apparatus as set forth in claim 2 characterized in that the modulation photogates and the accumulation gates and associated signal evaluation peripheral equipment and modulation peripheral equipment are produced in part on-chip and in part as a multi-chip module using CMOS-technology or BICMOS-technology.

20. Apparatus as set forth in claim 2 characterized in that arranged over the modulation photogates (1, 2) are strip lenses which focus substantially all the electromagnetic waves incident on the surface of a pixel element exclusively on to the modulation photogates (1, 2).

21. Apparatus as set forth in claim 2 characterized in that a plurality of PMD-pixels are arranged in a linear or matrix array.

22. Apparatus as set forth in claim 21 characterized in that associated with each said PMD-pixel is a microlens which concentrates the electromagnetic waves incident on the array onto the photosensitive surface of that PMD-pixel.

23. Apparatus as set forth in claim 2 characterized in that in a linear or matrix array has both PMD-pixels with 3D-functionality and also conventional CMOS-pixels with 2D-functionality used in mixed mode, wherein various adjacent items of pixel information are passed to a data-fusioning and interpolating device for reconstruction of a depth image.

24. Apparatus as set forth in claim 23 characterized in that associated with each said PMD-pixel is a microlens which concentrates the electromagnetic waves incident on the array onto the photosensitive surface of that PMD-pixel.

25. Apparatus as set forth in claim 2 characterized in that the apparatus provides photosensitive image-recording in a 3-D-vision camera.

26. Apparatus as set forth in claim 2 characterized in that the apparatus provides optical signal processing as a frequency- and phase-sensitive mixing or correlation element for signal acquisition, processing and noise suppression.

27. Apparatus as set forth in claim 2 characterized in that the apparatus provides an optical PLL-circuit or DLL-circuit which circuits are highly integrated and used in light barrier arrangements with each including various modulation modes.

* * * * *

UNITED STATES PATENT AND TRADEMARK OFFICE
CERTIFICATE OF CORRECTION

PATENT NO. : 6,777,659 B1
DATED : August 17, 2004
INVENTOR(S) : Rudolph Schwarte It is certified that error appears in the above-identified patent and that said Letters Patent is hereby corrected as shown below:

Column 5,
Line 20, delete the word "so";

Column 7,
Line 17, delete the hyphen in "separating-surfaces";

Column 10,
Line 7, delete the hyphen in "only-horizontally";

Column 11,
Line 67, in the phrase "the potential", replace "the" with -- a --;

Column 12,
Line 7, insert -- photomixing detector pixel -- before "PMD-pixel";
Line 7, place parentheses around "PMD-pixel";
Line 8, insert -- an -- after "reading-out diodes.";
Line 8, in the phrase "a (PMD-) pixel are divided" replace "a" with -- the --;
Line 8, remove the parentheses in the word "(PMD)";
Line 11, delete "are provided";
Line 11, in the phrase "the difference", replace "the" with -- a --;
Lines 11-12, in the phrase "the signals" delete "the";
Line 12, in the phrase "the readout lines", delete "the";
Line 19, insert -- of the electromagnetic waves -- after "wavelength";
Line 19, replace the phrase "and characterized in that" with -- ,however --;
Line 21, in the phrase "an order", replace "an" with -- the --;
Line 21, insert -- or -- after "magnitude";

Signed and Sealed this

Fourteenth Day of December, 2004

JON W. DUDAS
*Director of the United States Patent and Trademark Office*